United States Patent [19]

Baggen

[11] Patent Number: 4,802,173
[45] Date of Patent: Jan. 31, 1989

[54] METHOD OF AND DEVICE FOR DECODING A BLOCK OF CODE SYMBOLS WHICH IS DISTRIBUTED BETWEEN CODE WORDS IN TWO WAYS, EACH CODE WORD BEING PROTECTED BY A MAXIMUM DISTANCE SEPARABLE CODE

[75] Inventor: Constant P. M. J. Baggen, Eindhoven, Netherlands

[73] Assignee: U.S. Philips Corporation, New York, N.Y.

[21] Appl. No.: 5,515

[22] Filed: Jan. 16, 1987

[30] Foreign Application Priority Data

Jun. 5, 1986 [NL] Netherlands ............... 8601446

[51] Int. Cl.$^4$ ............................................. G06F 11/10
[52] U.S. Cl. ........................................ 371/40; 371/37
[58] Field of Search ............ 371/37, 38, 39, 41, 371/42, 40, 50, 53

[56] References Cited

U.S. PATENT DOCUMENTS

| | | | |
|---|---|---|---|
| 4,564,945 | 1/1986 | Glover et al. | 371/38 |
| 4,637,021 | 1/1987 | Shenton | 371/40 |
| 4,646,301 | 2/1987 | Okamoto | 371/40 |
| 4,653,052 | 3/1987 | Doi | 371/39 |
| 4,660,200 | 4/1987 | Okamoto | 371/39 |
| 4,665,537 | 5/1987 | Moriyama | 371/39 |
| 4,675,869 | 6/1987 | Driessen | 371/37 |
| 4,706,250 | 11/1987 | Patel | 371/39 |

FOREIGN PATENT DOCUMENTS 2156555 10/1985 United Kingdom .

Primary Examiner—Michael R. Fleming
Attorney, Agent, or Firm—Thomas A. Briody; Jack E. Haken; Anne E. Barschall

[57] ABSTRACT

A block of code symbols is protected by a product code or a pseudo product code. First of all, all syndrome symbols are formed and all code words having a syndrome which deviates from zero are provided with a flag. Each non-redundant symbol forms part of a first code word and also of a second code word, the numbers of flags of first and second code words being separately summed. The code words are successively addressed and an error location is determined. When an error location forms part of an incorrect first code word as well as of an incorrect second code word, it is corrected; if the second code word is not signalled as being incorrect, however, the error will not be corrected. After correction, the syndromes are updated, the flags being updated and the summing results being decremented only if the syndromes of both relevant code words are zero. In the opposite case the flags will remain unmodified for the time being.

15 Claims, 4 Drawing Sheets

| D10 | D11 | D12 | D13 | D14 | D15 | D16 | D17 | D18 | D19 | Q11 | Q12 | Q13 |
|---|---|---|---|---|---|---|---|---|---|---|---|---|
| D20 | D21 | D22 | | | | | | | D29 | Q21 | Q22 | |
| D30 | D31 | D32 | D33 | | | | | | | Q31 | Q32 | |
| D40 | | | | | | | | | | Q41 | | Q43 |
| D50 | | | | | | | | | | | | Q53 |
| D60 | | | | | | | | | D69 | | | |
| D70 | D71 | | | | D75 | D76 | | D78 | D79 | Q71 | | Q73 |
| P10 | P11 | P12 | | | | P16 | P17 | | P19 | Q81 | | Q83 |
| P20 | P21 | | | | | | | P28 | P29 | Q91 | Q92 | Q93 |

$$H_P = \begin{pmatrix} 1 & 1 & \cdots & 1 & 1 \\ a^{25} & a^{24} & & a^1 & 1 \end{pmatrix}$$

$$H_Q = \begin{pmatrix} 1 & 1 & \cdots & 1 & 1 \\ a^{44} & a^{43} & & a^1 & 1 \end{pmatrix}$$

FIG.2

|    | 0 | 1 | 2 | 3 | 4 | ... | 40 | 41 | 42 |
|----|---|---|---|---|---|-----|----|----|----|
| 0  | 0000 | 0001 | 0002 | 0003 | 0004 | ... |  |  |  |
| 1  | 0043 | 0044 | 0045 | 0046 | 0047 | ... | 0040 | 0041 | 0042 |
| 2  | 0086 | 0087 | 0088 | 0089 | 0090 | ... | 0083 | 0084 | 0085 |
| 3  | 0129 | 0130 | 0131 | 0132 | 0133 | ... | 0126 | 0127 | 0128 |
| 4  | 0172 | 0173 | 0174 | 0175 | 0176 | ... | 0169 | 0170 | 0171 |
| 5  |  |  |  |  |  | ... | 0212 | 0213 | 0214 |
| 6  |  |  |  |  |  |  |  |  |  |
| 7  |  |  |  |  |  |  |  |  |  |
| 8  |  |  |  |  |  |  |  |  |  |
| 9  |  |  |  |  |  |  |  |  |  |
| 10 |  |  |  |  |  |  |  |  |  |
| 11 |  |  |  |  |  |  |  |  |  |
| 12 |  |  |  |  |  |  |  |  |  |
| ...|  |  |  |  |  |  |  |  |  |
| 22 | 0946 | 0947 | 0948 | 0949 | 0950 | ... | 0986 | 0987 | 0988 |
| 23 | 0989 | 0990 | 0991 | 0992 | 0993 | ... | 1029 | 1030 | 1031 |
| 24 | 1032 | 1033 | 1034 | 1035 | 1036 | ... | 1072 | 1073 | 1074 |
| 25 | 1075 | 1076 | 1077 | 1078 | 1079 | ... | 1115 | 1116 | 1117 |
| 26 | 1118 | 1119 | 1120 | 1121 | 1122 | ... | 1143 |  |  |
| 27 | 1144 | 1145 | 1146 | 1147 | 1148 | ... | 1169 |  |  |

HDDR & SR'S DATA
P PAR
Q PAR
P SEQ
Q SEQ

METHOD OF AND DEVICE FOR DECODING A BLOCK OF CODE SYMBOLS WHICH IS DISTRIBUTED BETWEEN CODE WORDS IN TWO WAYS, EACH CODE WORD BEING PROTECTED BY A MAXIMUM DISTANCE SEPARABLE CODE

BACKGROUND OF THE INVENTION

1. Field of the Invention

The invention relates to a method of correcting a block of code symbols which is divided into a first series of first code words of a first maximum distance separable code as well as into a second series of second code words of a second maximum distance separable code. Each correct code word of a code has a minimum distance with respect to any other correct code word of at least three, taken over the symbols. All non-redundant code symbols form part of a first code word as well as of a second code word.

2. Prior Art

A method of this kind is disclosed in the previous European patent application No. 156 440 (PHQ 84 008C) which is based on two Japanese patent application 84/57595/6. Therein, the maximum distance separable (MDS) code is formed by a (shortened) Reed-Solomon code, but other codes organized on the basis of symbols can also be used. A symbol is a group formed by a fixed number of bits, larger than one; preferably, said number each time amounts to eight bits. Use is often made of systematic codes at the symbol level where a separation exists between redundant and non-redundant symbols; however, the invention is not restricted thereto. The known system concerns the storage of digital data according to the so-called "Compact Disc" format for high-quality audio data whose reliability is further enhanced for given applications, for example for the storage of computer software. In the known system the data is first decoded in the same way as customarily performed for audio data, the redundancy of two Reed-Solomon codes being used for the correction of errors and also for the detection of further errors which cannot be corrected or which can probably not be corrected. These Reed-Solomon codes utilize an interleaving technique which is suitable for the correction of long burst errors and which can be advantageously executed on a real-time basis. Moreover, at the code block level or the sector level there is provided a pseudo-product code which can utilize error detection of the first two codes as pointer information in order to render the further error correction more reliable. This means that the relevant decoding per symbol requires at least one additional bit. Sometimes increasing this transfer bit width is a drawback.

In given other applications of the code of the kind set forth, such pointer information may even be absent, either because the decoding of the first two codes does not produce such pointer information or because such interleaving code is absent because the code is used in a different environment. For a minimum distance between the code words of three or more, taken over the symbols, per code word always one symbol will be correctable per se, but the risk of incorrect correction rapidly increases as the length of the code words increases. For a minimum distance larger than three, the risk of incorrect correction is smaller, but still remains significant in the case of long code words (comprising many symbols).

SUMMARY OF THE INVENTION

It is an object of the invention to render the decoding more reliable by making the ultimate execution of a correction in a code word dependent on additional error indication information which does not relate to the entire code word but only to the code symbol to be possibly corrected therein, thus making the error correction more reliable. According to the invention it is assumed that an incorrect correction could notably convert a code symbol which was correct thus far into an incorrect code symbol.

The object in accordance with the invention is achieved in that the method of the kind set forth includes the following steps:

a. collecting a complete block of code symbols;

b. determining all syndrome symbols of the first code words and the second code words, and forming a flag for each code word for which the syndrome deviates from zero;

c. summing for all first code words together the number of flags and summing, separately therefrom, the number of flags for all second code words;

d. determining an error location of a correctable error for a first code word having a syndrome which deviates from zero;

e. detecting a second code word which is indicated as being incorrect and which contains the relevant error location, and correcting the relevant error only in the case of a positive detection result, a next first code word being addressed in accordance with step d in the opposite case;

f. updating the syndromes of the relevant first code word and the relevant second code word after a correction in accordance with step e, updating the relevant two flags and decrementing the summing results of the numbers of flags exclusively if both updated syndromes are zero, and subsequently addressing a next first code word in accordance with step d;

g. interchanging the function of first code words and second code words after the addressing of at least all first code words indicated as being incorrect and repeating the steps d, e and f until two successive executions of the steps d, e, f do not produce a further modification for all current first code words;

h. supplying a block of code symbols with signalization of its correctness or incorrectness.

It has been found that many patterns of incorrect symbols can thus be quickly and correctly corrected; notably the premature signalization that a code word is correct is thus avoided. The invention also relates to a device for performing the method, including receiving means for receiving and collecting a complete block of code symbols, first arithmetic means which are fed by the receiving means in order to form a number of syndrome symbols per code word from the symbols received, updating means which are fed by the first arithmetic means in order to store a flag per code word for which the syndrome deviates from zero, and for separately updating a summing result for the number of flags for the first code words and for the second code words, second arithmetic means which are fed by the first arithmetic means in order to determine for each code word, if possible and necessary, one or more correction symbols, correction means which are fed by the receiving means and the second arithmetic means in order to add a correction symbol to an incorrect symbol, and an output device for presenting a preferably correct block to a user device, characterized in that there is provided a sequencer which has a number of positions in order to deter mine a correction symbol and a locator symbol in a position for any first code word, said sequencer including addressing means for addressing a syndrome of a relevant second code word by way of said locator symbol and also including a first detector for correcting, exclusively under the control of a latter syndrome which deviates from zero, the code symbol addressed by the latter locator symbol and for updating any syndrome relating thereto, and a second detector for controlling, exclusively under the control of a syndrome of the relevant second code word which then equals zero, the updating means so as to update the flags for the relevant first and second code word, to decrement the summing results, and to address subsequently a next first code word, the sequencer also including an interchanging device for interchanging, after having passed through all positions corresponding to at least the incorrect first code words, the function of first and second code words and for activating further positions of said positions, there being provided a third detector for detecting, upon activation of said interchanging device, any modification introduced during the two most recent passages along the then current first code words, and for activating said output device in the case of a negative detection result. An attractive implementation is thus realized as a result of the inclusion of a number of elementary detections.

Further attractive properties of the invention will be described in the dependent claims. Therein, aspects are realized which increase the processing speed and/or the reliability and/or the decoding capacity.

BRIEF DESCRIPTION OF THE DRAWING

The invention will be described in detail hereinafter with reference to some figures.

FIG. 2 is a detailed representation of a block of code symbols as used in a so-called CD-ROM format.

Figure 5:
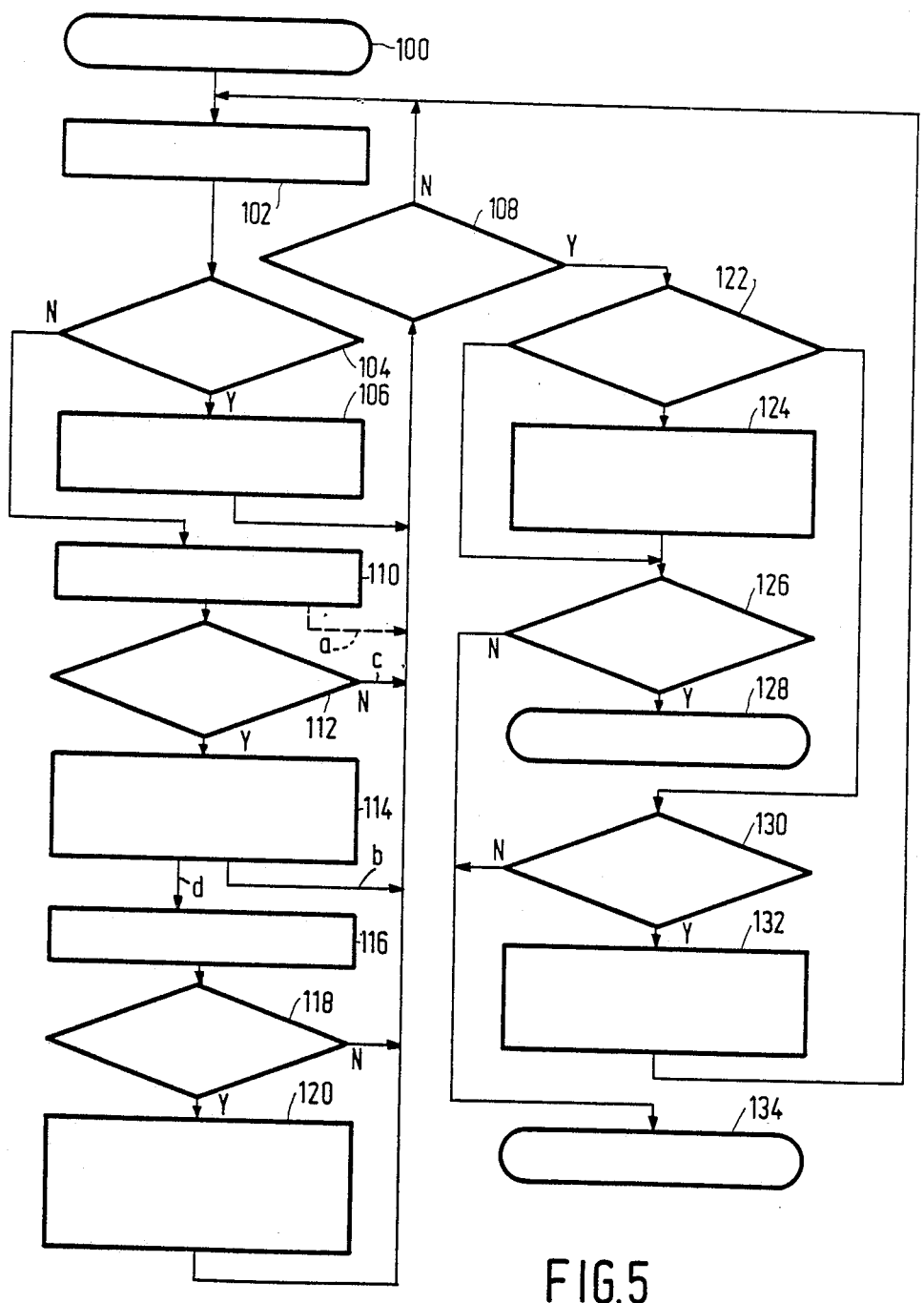
FIG. 5 shows a flowchart in accordance with the invention.

Appendix A contains a list of captions for FIG. 5.

DETAILED DESCRIPTION OF THE PREFERRED EMBODIMENTS

Figures 1, 3, 4:
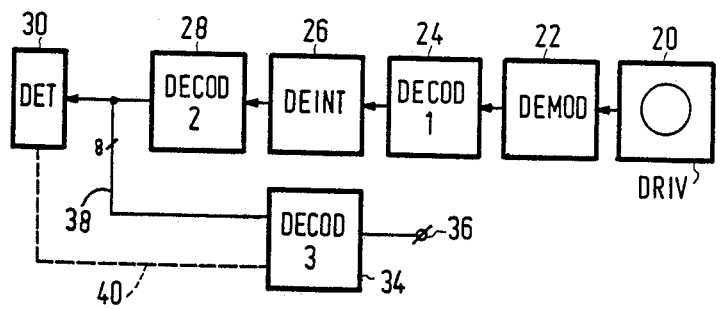
FIG. 1 shows symbolically an example of a set-up of a block of code symbols.
FIG. 3 shows the parity check matrix of the Reed-Solomon codes used.
FIG. 4 shows symbolically a device in accordance with the invention.

FIG. 1 shows symbolically a general example set-up of a block of code symbols in which each square represents a symbol. A symbol is a group formed by a fixed number of bits, for example three or four bits, but usually more. Eight is an attractive value in this respect. For longer symbols, the increasing complexity of the operations will usually become a drawback. For the sake of simplicity it is assumed that the code is systematic at the symbol level; however, this is not necessary for carrying out the invention.

In the present example, the block includes 70 data symbols which are numbered as $D10 \ldots D19$, $D20 \ldots D29$, $D30 \ldots D79$. The block contains ten first code words of a first Reed-Solomon Code, each of which includes seven data symbols and two redundant symbols. For example, the first word of this series contains the data symbols $D10 \ldots D70$ and the redundant symbols P10, P20. The second word contains the nine symbols of the second column. The tenth word contains the nine symbols of the tenth column. When the symbol length is sufficiently long, for these code words the minimum distance between two possibly correct code words may be equal to three as taken over the symbols. This means that one incorrect symbol can be corrected (or that at the most two incorrect code symbols can be detected).

On the other hand, the block contains nine second code words of a second Reed-Solomon code. Each of these words contains three redundant symbols and ten other symbols. The other symbols may be data symbols or redundant symbols of first words of the Reed-Solomon code. For example, the first word of this series contains the data symbols $D10 \ldots D19$ and the redundant symbols Q11, Q12, Q13. The second word contains the thirteen symbols of the second row. The ninth word contains the thirteen symbols of the ninth row, that is to say the redundant symbols $P20 \ldots P29$, each of which is associated with a first code word of the first Reed-Solomon code, and the redundant symbols Q91, Q92, Q93 of the second Reed-Solomon code. When the symbol length is sufficiently long, for the latter code words the minimum distance between two possibly correct code words may be equal to four as taken over the symbols. This means that one incorrect symbol can be corrected and that, moreover, a second incorrect symbol can be detected (or that at the most three incorrect code symbols can be detected).

The same generator matrix is used for all code words of the first Reed-Solomon code. The same generator matrix is used for all code words of the second Reed-Solomon code. In that case each of the eleventh up to and including thirteenth columns also forms a first code word of the first Reed-Solomon code in which the symbols $Q81 \ldots Q83$, $Q91 \ldots Q93$ act as redundant symbols and the symbols $Q11 \ldots 13$, $Q21 \ldots 23$, $Q71 \ldots 73$ act as data symbols. Thus, all symbols each time form part of a first code word of the first code, as well as of a second code word of the second code. Such a configuration is referred to as a (real) product code.

The set-up of the block can be modified. For example, the numbers of data symbols per code word may be different; they may also be the same for both codes. The numbers of redundant symbols per code word may also be different, but for a correction on the basis of only one code word it must amount to at least two. Furthermore, a pseudo product code may be concerned, in which not all redundant symbols also form part of two code words. The following is an example: the vertical code words are formed in the same way as shown in FIG. 1. The horizontal code words are not formed; instead, diagonal code words are formed: the first code word then consists of, for example the symbols D10, D21, D32, ..., D76, P17, P28, D19, Q21, Q32, Q43. The second code word consists of the symbols D20, D31, .. . D75, P16, ..., D18, D29, ..., Q31, ... Q53, and so on. In that case the same generator matrices are each time used for all vertical code words as well as for all diagonal code words. However, the symbols $Q11 \ldots Q93$ do not form part of a vertical code word in that case. Other ways of forming a pseudo product code are also feasible. In that case the indication for a code symbol to be corrected can be derived in different ways from one or more code words containing the code symbol to be possibly corrected. Symbol correcting codes other than Reed Solomon codes are also known, for example by-adjacent codes.

FIG. 2 is a detailed representation of the set-up of a block of code symbols as used for a so-called CD-ROM format; this is a preferred embodiment. There are 43×24 8-bit data symbols. There are 43 P-code words of a (26, 24) Reed-Solomon code; all these codes words are arranged in a column. There are 26 words of a (45, 43) Reed-Solomon code. As far as the data symbols are concerned, these words are arranged according to the diagonal shown. The redundant symbols are shown on the two bottom lines. Thus, the Q-redundancies do not form part of the P-words.

THE DECODING PHILOSOPHY

The code format of FIG. 2 means that per code word each time one error symbol can be corrected, or that two error symbols can be detected. In this respect FIG. 3 shows the parity matrices $H_P$, $H_Q$ of the Reed-Solomon codes used. The generator polynomial of the relevant Galois field is $(x^8+x^4+x^3+x^2+1)$, a being the root thereof and hence a primitive element of the Galois field. All calculations are performed in this field. When one error symbol is corrected in a code word, but actually more than one symbol is incorrect, the chance that this fact will not be noticed amounts to approximately $n/2^m$, m being the length of the symbol in bits and n being the length of the code word in symbols. For the P-code and the Q-code this chance amounts to approximately 10% and 18%, respectively. The chance that an incorrect code word will not be detected as such amounts to $\frac{1}{2}^{2m}=1.5\times10^{-5}(\frac{1}{2}^{3m}$ in the case of three redundant symbols per code word).

Decoding will be substantially accelerated when all syndromes are calculated only once and when only the contribution of the correction to the syndrome symbols is determined when a code symbol is corrected. For example, assume that a symbol of the first P-code word (first column in FIG. 2) is corrected. In that case the syndrome symbols of the Q-word of which the relevant symbol forms part must be corrected in accordance with:

$$S0'=S_0+Y$$

$$S1'=S_1+a^{44}Y.$$

When the corrected symbol is, for example number 0946, the associated Q-word will be composed of the symbols 946, 990, 1034, 1078, 4, 48, . . . 558, 602. The exponent (44) follows directly from the parity matrix $H_Q$. Therein, Y is the magnitude of the correction (expressed as a symbol). For other symbols to be corrected the syndromes are corrected by the symbol correction Y multiplied in $GF(2^8)$ by the appropriate power of a. Therefore, there are as many syndrome symbols as there are redundant symbols: $2\times43+2\times26=138$. The data symbols are numbered from 0000 to 1031. The redundant symbols of the P-words are numbered from 1032 to 1117. The redundant symbol having the rank number MP, associated with the code word having the rank number NP, then has the number $((43\times MP)+NP)$. The redundant symbols of the Q-words are numbered from 1118 to 1169. The redundant symbol having the rank number MQ associated with the code word having the rank number NQ then has the number $(44\times MQ+43\times NQ)$ mod. 1118.

It will be apparent that for the decoding of the P-words the relevant rank number NP is known. From the decoding operation the rank number MP of the symbol to be corrected can be derived. From MP and NP there can be found MQ and NQ in order to derive from the correction the modification to be applied to the syndrome symbols of the Q-code. Conversely, the same holds good for the correction of a word of the Q-code. The following holds good for the numbers of the data symbols:

$$NP=MQ$$

$$43\times MP+NP=(44\times MQ+43\times NQ) \text{ mod. } 1118.$$

In the case of a P-correction it follows therefrom that:

$$MQ=NP$$

In the case of a Q-correction:

$$NP=MQ$$

$$MP=MQ-NQ \text{ mod. } 26.$$

The latter holds good only for the symbol numbers 0-1117, because the Q-redundancy symbols do not form part of any word of a P-code.

However, when a real product code (FIG. 1) is concerned, it will always be necessary to modify the syndromes of both code words of which the relevant code symbol forms part in the case of a correction. In that case, moreover, MQ=NP and MP=NQ.

EMBODIMENT OF A READ DEVICE INCLUDING A DECODER IN ACCORDANCE WITH THE INVENTION

FIG. 4 shows a block diagram of a device for use in accordance with the invention. The storage medium is formed by a disc having a diameter of 12 cm on which channel bits are stored in the form of optically readable recesses as known for the "compact disc". Block 22 represents a turntable with motor, servo system, centering system, laser system, tracking system, etc. The invention, however, does not relate to the specific operation of these elements. The read system produces channel bits. In the demodulator 22 a series of 17 successive channel bits (including spacing bits) is converted into a code symbol having 8 code bits. In the first decoder 24 a frame of 32 code symbols is formed by de-scrambling. This frame is decoded by way of redundant symbols contained therein, so that 28 code symbols remain. During decoding, a correction of one or more symbols may take place. For the sake of brevity this decoding operation will not be described herein. The code is a Reed-Solomon code. Other symbol correcting codes can also be used. In the de-interleaving element 26 the 28 code symbols are de-interleaved between a corresponding number of frames contain 28 symbols each. In the second decoder 28 such a frame is decoded by way of four redundant symbols contained therein, so that 24 code symbols remain. During this decoding operation, one or more symbols may be corrected. For the sake of brevity, this decoding operation will not be described either. The decoded symbols appear in the form of 8 bits in parallel on line 38. A further symbol-wise regrouping of the symbols also takes place, but this operation will not be described for the sake of brevity.

The symbols on the output of the element 28 are organized as sectors having the format shown in FIG. 2. To this end, the element 28 may include a further device for reconstructing the sequence of the symbols (as known from the cited Patent Application). Descrambling, deinterleaving and reconfiguration can often be advantageously performed by means of a random access memory (RAM) in which a larger number of delay lines or FIFOs having different delay times/lengths are implemented. This is a customary approach and the relevant equipment will not be described herein. The blocks 22-28 thus have mainly a function-specifying function; at the hardware level the organization is usually centred on a bus cooperating with ALU, memory, and I/O sub-systems.

A sector contains first of all synchronization information, followed by header data, possibly sub-header data, and finally other data. Element 30 is a detector. This detector is activated by the synchronization information, this is possible in that the synchronization information has a content which in principle does not occur elsewhere in the data stream. After the recognition of this information, a symbol counter in the detector is activated for counting down the symbols received. It is thus known when the synchronization information is succeeded by the further data which is protected by the maximum distance separable codes. A specific symbol may indicate that this code has indeed been implemented or left out. The detection signal is applied to the decoder 34 as an initiation signal via the line 40. This signal resets address counters to given initial values and adjusts other quantities as will be described with reference to FIG. 5. The decoder 34 may thus be a programmed (micro) processor comprising elements as described, be it for a different code, in the previous Netherlands patent application No. 8400629 (corresponding U.S. patent application Ser. No. 705 752) in the name of Applicant, incorporated herein by way of reference. Also provided are a unit for executing operations in the relevant Galois field, a data memory, a syndrome memory, a memory for the flags of the first and the second code words and a counting mechanism for determining two sums thereof, a program memory and associated addressing and decoding means, as well as connection means for interconnecting said elements. For one sector, therefore, there can be stored at least 1032 data symbols and 138 redundant symbols (or 138 syndrome symbols), 69 flags, two count values, and a number of auxiliary quantities (see hereinafter).

After the decoding operation, the restored data can be made available to a user device (not shown for the sake of simplicity) via an output 36. The correction may then already have taken place; alternatively, it is possible to present only the correction quantities themselves (locator+corrector) when the data has already been made available to the user device in a different way. Moreover, the device 34 provides an indication "correct/incorrect", depending on the quality of the decoding result.

THE DECODING STRATEGY

The general strategy will be described with reference to the flowchart of FIG. 5. First the entire contents of a sector are collected, at least in as far as it concerns the part which is protected by the pseudo product code (100). All syndrome symbols of the P-words are then determined. All P-words having a syndrome deviating from zero are assigned a first label (flag) and the first labels are counted for the entire code block: CP. Subsequently, all syndrome symbols for the Q-words are determined. All Q-words having a syndrome deviating from zero are assigned a second label and these second labels are counted for the entire code block: CQ. For given applications use can be made of trivalent or multi-valent flags. For example, in that case a flag "00" means: code word is correct and has always been correct; "11" means: code word has a syndrome deviating from zero; "10" means: code word has been corrected so that the syndrome subsequently became zero (so 01 does not occur in that case). Thus, also after correction a given degree of signalization of the number of corrected errors is present. After determination of the two counts, the system decides whether decoding commences with the P-code words or with the Q-code words. When the number of P-labels is larger than or equal to the number of Q-labels, decoding commences with the P words; x:=P; y:=Q. In the (less likely) case that there are more Q-labels than P-labels, decoding commences with the Q words: y:=P; x:=Q. It has been found that on average this choice in first instance reduces the number of errors per code word to be decoded, so that the chances for an immediate success are higher. When the first and the second code have a different minimum distance between the relevant code words, it is usually advantageous to start with the code words of the code having the largest distance. Finally, a number of arithmetic parameters are adjusted to the correct values, such as the number of x-words and y-words, a rank number for a current word, and the values of a bivalent quantity corrx are set to "false" and those of a bivalent quantity corry are set to "true". The system subsequently proceeds to block 102 in which the next x-code word is addressed: in this case the first one. In block 104 it is detected whether the syndrome of this word equal zero. If this is the case, the label (x-label) of this code word is set to zero (updated) and the sum of the relevant labels is decremented (106), of course if this label had the value 1. If this label had the value zero, the system proceeds to block 108 without any action being undertaken. Faster operation is achieved in that in the block 102 the next first code word having a label deviating from zero is addressed. In block 108 it is then detected whether the relevant x-word was the last one of the series of labelled x-words. Often this will not be the case, so that the system proceeds to the block 102 again. When a syndrome deviating from zero is detected in the block 104, the system proceeds to block 110. Therein, the location of the presumably sole incorrect symbol is calculated. In block 112 it is detected whether the relevant symbol forms part of a y-word whose label also has the value 1. Various possibilities exist:

a. the location of the incorrect symbol is situated beyond the boundaries of the code word, because the symbol number is larger than 45 or 23, respectively;
b. the relevant incorrect symbol forms part of only one code word;
c. the relevant y-word has a label with value "0";
d. the relevant y-word has a label with value "1".

Consequently, the correction is impossible in case a; this indicates that a definitely non-correctable error is present at that instant, for example in that actually two symbols of the relevant code word are incorrect. This error may possibly be corrected at a later stage (see hereinafter). Case b is corrected, but as an additional protection the label associated with the relevant code word remains un modified Case c is considered to be too uncertain and the correction is not performed; the labels also remain unmodified (however, it could concern a proper correction when the relevant y word contained a non-detectable error). Case d is considered to be a sufficiently "reliable" correction which is therefore, performed. Thus, in the case a, c the system returns to the block 108. When the test in the block 112 is positive (Y), the system proceeds to block 114 in which the error is corrected. This can always take place. The quantity corrx is made "true" (if it already was true, it remains so). This indicates that at least one correction has been performed during the passage through the x words. Subsequently, in the block 114 the syndrome of the relevant x-code word is set to zero This is always correct because of the minimum distance of three. Moreover, in block 116 the syndrome of the relevant y-word is updated in order to take into account the correction performed. Updating requires fewer calculations than the total recalculation of the syndrome of the relevant word. Correction of a code word results in a syndrome zero even when the minimum distance of a code is larger than three, so that it can then be immediately postulated to zero. In block 118 it is detected whether the modified y-syndrome has the value 0. If this is not the case, the system returns to the block 102. If the modified y-syndrome has value "0", both labels are set to zero (updated) in block 120 and both counts are decremented. The system subsequently returns to the block 102. The above cases a to d are indicated at the relevant transitions. Implicit detections of the cases a, b in the blocks 110, 114, respectively, have been omitted for the sake of simplicity.

When the last word has been treated (block 108 produces a positive result), the system proceeds to block 122. Therein it is detected whether the number of x-labels equals at the most two. When the number is larger than two, the system proceeds to block 130. Therein, it is checked whether any correction has taken place during the last correction operation (x-words) or during the last operation but one. If neither is the case, no further corrections can be performed and the system proceeds to block 134 : error. The code block is not correctable. After the first correction operation, this move cannot be made, because a dummy "zero$^{th}$" correction has been emulated by the initial postulation of corry. If a correction has taken place, the system proceeds to block 132; the functions of x and y are interchanged therein. Moreover, the quantity corrx is set to "false". One of the initialization steps in the block 100 similarly consists in that a given value is also assigned to corry, notably the value "true". Furthermore, the word counter is set to an initial value so that the first word will indeed be addressed in the block 102.

When it is detected in the block 122 that only one or two x-labels remain, the system will perform a correction of the y-words, the x-labels then acting as pointer information. When the number of x-labels amounts to zero, this will be a dummy operation and the system will proceed directly to the block 126. When the number of x-labels amounts to 1 or 2, it is assumed that all y-words having a syndrome which is not equal to zero are incorrect exactly in the relevant x-word location.

When the system finally reaches the block 126, a CRC information which is known from the cited publication and which is contained in the data symbols of the code block is used to detect whether the correction is correct. If this is so, the system proceeds to the block 128 and the user information can be made available. If this is not the case, the system proceeds to the block 134 Any further attempts to retrieve the data (by way of a read retry, shadow information and the like) are beyond the scope of the present invention. In block 134 it is signalled that correction is impossible. When it is detected in the block 122 that the number of flags amounts to three or more (at least equal to the minimum distance of the y-code words), the system proceeds to the block 130. Therein, it is detected whether any correction has taken place. After the first attempts, a zero$^{th}$ attempt (corry) is emulated. If no modification has taken place (N), correction will be impossible and the system will proceed to the block 134. If any modification has taken place, the system will proceed to the block 132. In given cases only corrx can be considered in the block 130. In the block 132 the value of corrx is taken over; thereafter, corrx is initialized again. The functions of the x-words and the y-words are interchanged in one operation (denoted by parentheses). The system will subsequently return to the block 102.

Figure 6A:
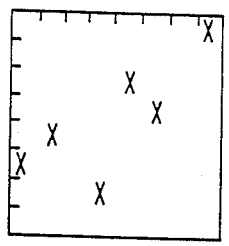
FIGS. 6a-6f shows some examples of error patterns.
Figure 6B:
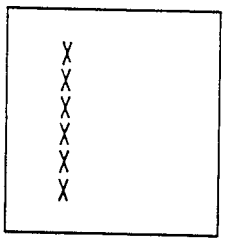
Figure 6C:
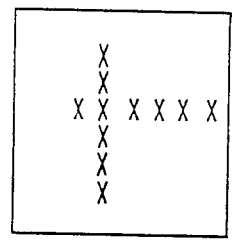
Figure 6D:
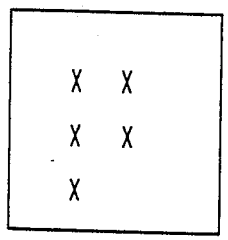
Figure 6E:
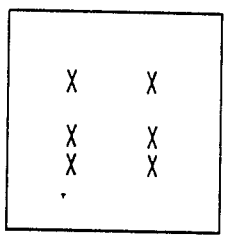
Figure 6F:
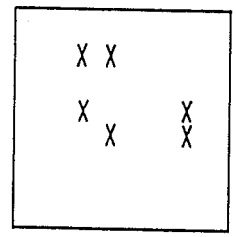

FIGS. 6a-6f show some specific error patterns, for which a real product code with a minimum distance of three over the symbols is assumed. FIG. 6a shows six errors (crosses) in a block of 8×8 symbols. These errors concern each time a different row as well as a different column (P-word and Q-word, respectively), so that all corrections will have been performed after one addressing operation in one direction. In FIG. 6b all errors are situated in one column. Correction of the code word of this column, therefore, is impossible. Correction of the row words, however, immediately results in a completely corrected code block. In FIG. 6c one row cannot be corrected. One column is also non-correctable. All other rows and all other columns are correctable. During the first series of addressing operations all row words (except the relevant one) can be corrected. During the subsequent series of addressing operations, all column words can be corrected. In FIG. 6d correction can be achieved only if the one row word having one incorrect symbol is corrected. In that case there are two words containing two incorrect symbols in both directions. For example, the two incorrect column words are then corrected the indication of the incorrect row locations (label) being used as pointer information. This is an example of a pattern which is corrected in accordance with block 124 in FIG. 5. FIG. 6e shows a pattern in which only row words can be corrected, utilizing pointer information formed over a column. FIG. 6f shows an example of a simple pattern which cannot be corrected.

Appendix A

100: start
102: next labeled x-word
104: syndrome=zero?
106: remove x-label, decrement x-count
108: last labeled x-word?
110: calculate error location
112: corresponds to labeled y-word?
114: correct symbol; corrx:=true; x-syndrome:=0
116: modify y-syndrome
118: modified y-syndrome=zero?
120: remove x-label; decrement x-count
    remove y-label; decrement y-count
122: 0<x-count<3?
124: 1,2 erasure correction in y-direction, x-labels locate C.R.C. O.K.?
O.K., STOP 130: corrx+corry=true?
132: corrx;=corry; corrx:=false; (y:=x; x:=y)
134: error, stop.

What is claimed is:

1. A method of correcting a block of code symbols which is divided into a first series of first code words of a first maximum distance separable code as well as into a second series of code words of a second maximum distance separable code, each correct code word of a code having a minimum distance with respect to any other correct code word of at least three, taken over the symbols, all non-redundant code symbols forming part of a first word as well as of a second code word, which method includes the following steps:
   a. collecting a complete block of code symbols;
   b. determining all syndrome symbols of the first code words and the second code words, and forming a flag for each code word for which the syndrome deviates from zero;
   c. summing for all first code words together a number of flags and summing, separately therefrom, a number of flags for all second code words;
   d. determining an error location of a correctable error for a current first code word having a syndrome which deviates from zero;
   e. first detecting, whether a current second code word exists which contains the error location, and second detecting whether the current second code word is indicated as incorrect, and correcting the correctable error if the first and second detecting steps give a positive result but omitting correction if the first and second detecting steps give opposite results; and, upon such omitting, addressing a next first code word in accordance with step d;
   f. updating the syndromes of the current first code word and the current second code word after a correction in accordance with step e, updating the two flags associated with the current first and second code words to reflect whether the syndromes of the current first and second code words are zero, and decrementing the summing results of the numbers of flags if both syndromes are zero, and subsequently addressing a next first code word in accordance with step d;
   g. interchanging the function of first code words and second code words after the addressing of at least all first code words indicated as being incorrect and repeating the steps d, e and f until two successive executions of the steps d, e, f do not produce a further modification for any current first code words; and
   h. supplying a block of code symbols including all first and all second code words with signalization of its correctness or incorrectness.

2. A method as claimed in claim 1, characterized in that for a first code word of a maximum distance separable code having a minimum distance of three over the code symbols the relevant syndrome is always set to zero after the execution of a correction.

3. A method as claimed in claim 1 or 2, characterized in that when a first code word is addressed, under the control of a flag formed for the relevant code word in accordance with the step d a syndrome which deviates from zero is detected, while in the opposite case the relevant flag and the relevant summing result are updated.

4. A method as claimed in claim 3, characterized in that when a summing result of the flags of the first code words is reached which at the most equals the minimum distance for the current second code words reduced by one, these second code words are subsequently corrected in an erasure mode during which any flag of a first code word acts as an error pointer.

5. A method as claimed in claim 3, characterized in that after termination of said correction operation, a recalculation of an error detection code present in the code block is performed during a final step in order to form said signalization of correctness or incorrectness.

6. A method as claimed in claim 1 or 2, characterized in that when a summing result of the flags of the first code words is reached which at the most equals the minimum distance for the current second code words reduced by one, these second code words are subsequently corrected in an erasure mode during which any flag of a first code word acts as an error pointer.

7. A method as claimed in claim 6, characterized in that after termination of said correction operation, a recalculation of an error detection code present in the code block is performed during a final step in order to form said signalization of correctness or incorrectness.

8. A method as claimed in claim 1 or 2, characterized in that after termination of said correction operation, a recalculation of an error detection code present in the code block is performed during a final step in order to form said signalization of correctness or incorrectness.

9. The method of claim 1 comprising the further step of always setting a relevant syndrome to zero after execution of a correction, the first code words having a maximum distance separable code having a minimum distance of three over the code symbols.

10. The method of claim 1 wherein step d comprises:
    detecting whether a syndrome deviates from zero under control of the flag corresponding to the current first code word, and
    updating the flag and the number of flags corresponding to the current first code word when the when the syndrome does not deviate from zero.

11. The method of claim 1 comprising correcting, in an erasure mode, the second code words, when the number of the flags for the first code words reaches one less than the minimum distance for the second code words.

12. The method of claim 1 wherein step h comprises recalculating an error detection code to form said signalization of correctness or incorrectness.

13. A device for correcting a block of code symbols which is divided into a first series of first code words of a first maximum distance separable code as well as into a second series of second code words of a second maximum distance separable code, each correct code word of a code having a minimum distance with respect to any other correct code word of at least three, taken over the symbols, all non-redundant symbols forming part of a first code word as well as of a second code word, which device comprises:
   (a) receiving means for receiving and collecting a complete block of code symbols,
   (b) first arithmetic means, fed by the receiving means, for forming a first number of syndrome symbols per code word from the symbols received,
   (c) updating means, fed by the first arithmetic means, for storing a flag for each code word for which the syndrome deviates from zero, and for separately updating a summing result for a second number of flags for the first code words and a third number of flags for the second words, (d) second arithmetic means, fed by the first arithmetic means, for determining for each code word, if possible and necessary, one or more correction symbols, (e) correction means, fed by the receiving means and the second arithmetic means, for adding a correction symbol to an incorrect symbol, and (f) an output device for presenting a preferably correct block to a user device, (g) a sequencer which has a fourth number of positions in order to determine a correction symbol and a locator symbol in a position for any first code word, said sequencer including (i) addressing means for addressing a syndrome of a relevant second code word by way of said locator symbol, (ii) a first detector for correcting, under the control of a latter syndrome which deviates from zero, the code symbol addressed by a latter locator symbol and for updating any syndrome relating thereto, (iii) a second detector for controlling, exclusively under the control of a syndrome of the relevant second code word which syndrome equals zero, the updating means so as to update the flags for the relevant first and second code word, to decrement the summing results, and to address subsequently a next first code word, and (iv) an interchanging device for interchanging, after having passed through all positions corresponding to at least all incorrect first code words, the function of said first and second code words and for activating further positions of said positions, and (h) a third detector for detecting, upon activation of said interchanging device, any modification introduced during the two most recent passes along the then current first code words, and for activating said output device in the case of a negative detection result.

14. A device as claimed in claim 13, comprising a fourth detector for detecting a non-updated flag and for activating, exclusively under the control of a positive detection result, the position of the sequencer for the relevant first code word.

15. A device as claimed in claim 13 or 14, comprising a fifth detector for a summing result of the flags of the first code words which at the most equals the minimum distance for the then current second code words reduced by one in order to activate the interchanging device under the control of a positive detection result, and for subsequently activating the second arithmetic means for correcting the then current first code words during an erasure mode in which any flag of a then current second code word acts as an error indicator.

* * * * *

UNITED STATES PATENT AND TRADEMARK OFFICE
CERTIFICATE OF CORRECTION

PATENT NO. : 4,802,173
DATED : January 31, 1989
INVENTOR(S) : Constant P.M.J. Baggen It is certified that error appears in the above-identified patent and that said Letters Patent is hereby corrected as shown below:

Col. 2, Line 51, after "avoided." create new paragraph with --The invention ......";

Col. 6, Line 18, insert --NQ=MP-NP mod. 26.--

Col. 8, Line 68, change "un modified Case" to --unmodified. Case--;

Col. 10, Line 1, after "134" insert --.--;
      Line 67, before "C.R.C. O.K.?" insert --126:--;
      Line 68, before "O.K., STOP" insert --128:--;

Col. 11, Line 2, after "corrx" change ";" to --:--.

Signed and Sealed this

Eighth Day of June, 1993

MICHAEL K. KIRK

Attest:

Attesting Officer

Acting Commissioner of Patents and Trademarks

UNITED STATES PATENT AND TRADEMARK OFFICE
CERTIFICATE OF CORRECTION

PATENT NO. : 4,802,173
DATED : January 31, 1989
INVENTOR(S) : CONSTANT P.M.J. BAGGEN It is certified that error appears in the above-identified patent and that said Letters Patent is hereby corrected as shown below:

Col. 12, Claim 10, line 38, delete "when the" (first occurrence).

Signed and Sealed this

Thirteenth Day of July, 1993

Attest:

MICHAEL K. KIRK

*Attesting Officer*    *Acting Commissioner of Patents and Trademarks*